(12) United States Patent
Kakinuma et al.

(10) Patent No.: US 7,991,377 B2
(45) Date of Patent: Aug. 2, 2011

(54) MIXER AND FREQUENCY CONVERTING APPARATUS

(75) Inventors: Yuji Kakinuma, Tokyo (JP); Keiji Koga, Nagano (JP)

(73) Assignee: TDK Corporation, Tokyo (JP)

( * ) Notice: Subject to any disclaimer, the term of this patent is extended or adjusted under 35 U.S.C. 154(b) by 408 days.

(21) Appl. No.: 12/391,440

(22) Filed: Feb. 24, 2009

(65) Prior Publication Data

US 2009/0243698 A1 Oct. 1, 2009

(30) Foreign Application Priority Data

Mar. 31, 2008 (JP) ................................ 2008-089569

(51) Int. Cl.
*H04B 1/26* (2006.01)
(52) U.S. Cl. .......................... 455/323; 455/326; 327/356
(58) Field of Classification Search .................. 455/113, 455/313, 323, 326, 333; 327/113, 116, 119, 327/355, 356
See application file for complete search history.

(56) References Cited

U.S. PATENT DOCUMENTS 6,947,316 B2 * 9/2005 Takahashi et al. ............ 365/158
7,808,229 B2 * 10/2010 Koga et al. ................. 324/117 R
7,825,658 B2 * 11/2010 Koga et al. ..................... 324/252

OTHER PUBLICATIONS

Tulapurkar et al., "Spin-torque diode effect in magnetic tunnel junctions", 2005 Nature Publishing Group, Nature Vo. 438, Nov. 17, 2005, pp. 339-342.
Suzuki et al., "Microwave Properties of Spin Injection Devices—Spontaneous Oscillation, Spin—Torque Effect and Magnetic Noise-", Magune vol. 2, No. 6, 2007, pp. 282-290, and English language translation of Sections 3.1 and 3.3.

* cited by examiner

*Primary Examiner* — Long Nguyen
(74) *Attorney, Agent, or Firm* — Greenblum & Bernstein, P.L.C.

(57) ABSTRACT

A mixer includes: a magnetoresistive effect element including a fixed magnetic layer, a free magnetic layer, and a nonmagnetic spacer layer disposed between the fixed magnetic layer and the free magnetic layer; and a magnetic field applying unit that applies a magnetic field to the free magnetic layer. The mixer is operable, when a first high-frequency signal and a second high-frequency signal as a local signal are inputted, to multiply the first high-frequency signal and the second high-frequency signal using the magnetoresistive effect element and to generate a multiplication signal. A frequency converting apparatus includes the mixer and a filter operable, when a higher frequency and a lower frequency out of frequencies of the first high-frequency signal and the second high-frequency signal are expressed as f1 and f2 respectively, to pass one out of a frequency (f1+f2) and a frequency (f1−f2) out of the multiplication signal.

7 Claims, 4 Drawing Sheets

MIXER AND FREQUENCY CONVERTING APPARATUS

BACKGROUND OF THE INVENTION

1. Field of the Invention

The present invention relates to a mixer that generates a multiplication signal using a magnetoresistive effect element and a frequency converting apparatus equipped with such mixer.

2. Description of the Related Art

A TMR (Tunnel MagnetoResistive) element constructed with a spacer layer formed of a nonmagnetic material between a fixed magnetic layer and a free magnetic layer is known as one example of a magnetoresistive effect element. In a TMR element, spin-polarized electrons flow when a current passes, and the magnetic orientation of the free magnetic layer (i.e., the orientation of an electronic spin) changes in accordance with the number of spin-polarized electrons that accumulate inside the free magnetic layer. When an attempt is made to change the magnetic orientation of a free magnetic layer that has been disposed in a certain magnetic field, torque will act so as to restore the electron spin to a stable orientation that is restricted by the magnetic field, and when the electron spin are perturbed with a specific force, oscillation referred to as "spin precession" will occur.

In recent years, a phenomenon called "spin torque ferromagnetic resonance" has been discovered whereby when a high-frequency AC current flows in a magnetoresistive effect element such as a TMR element, strong resonance will occur if the frequency of the AC current that flows through the free magnetic layer matches the oscillation frequency of the spin precession that is attempting to restore the magnetic orientation (see Tulapurkar, A. A. et al. 2005. Spin-torque diode effect in magnetic tunnel junctions. *Nature* 438: 339-342). It is also known that when an RF current (i.e., an RF current with a frequency that matches the oscillation frequency (resonant frequency) of the spin precession) is injected into a magnetoresistive effect element in a state where a static magnetic field is being applied to the magnetoresistive effect element from outside and the orientation of the static magnetic field is inclined by a predetermined angle in the fixed magnetic layer to the magnetic orientation of the fixed magnetic layer, the magnetoresistive effect element will function so that a DC voltage in proportion to the square of the amplitude of the injected RF current is generated across both ends of the magnetoresistive effect element, or in other words, achieve a square-law detection function (or the so-called "spin torque diode effect"). It is also known that the square-law detection output of such magnetoresistive effect element will exceed the square-law detection output of a semiconductor pn junction diode under predetermined conditions (see Suzuki, Y. et al. 2007. Microwave properties of spin injection devices: Spontaneous oscillation, spin-torque diode effect and magnetic noise. *Magune* 2(6): 282-290).

SUMMARY OF THE INVENTION

However, even though the above phenomenon of TMR elements is known, no magnetic device that can put such phenomenon to industrial use is known, and application of such discovery is awaited. By carrying out thorough research, the present inventors focused on the square-law detection function of a magnetoresistive effect element and investigated its application to a mixer capable of operating on low local power.

The present invention was conceived to solve the problem described above and it is a principal object of the present invention to provide a mixer capable of operating on low local power and a frequency converting apparatus equipped with such mixer.

To achieve the stated object, a mixer according to the present invention includes: a magnetoresistive effect element including a fixed magnetic layer, a free magnetic layer, and a nonmagnetic spacer layer disposed between the fixed magnetic layer and the free magnetic layer; and a magnetic field applying unit that applies a magnetic field to the free magnetic layer, wherein the mixer is operable, when a first high-frequency signal and a second high-frequency signal as a local signal are inputted, to multiply the first high-frequency signal and the second high-frequency signal using the magnetoresistive effect element and to generate a multiplication signal.

According to the above mixer, by including the magnetoresistive effect element and the magnetic field applying unit that applies a magnetic field to the free magnetic layer and multiplying a first high-frequency signal and a second high-frequency signal as a local signal when inputted using the magnetoresistive effect element to generate a multiplication signal, the first high-frequency signal and the second high-frequency signal are mixed (multiplied) using a square-law detection function (spin torque diode effect) realized when the magnetoresistive effect element resonates. By doing so, it is possible to mix (multiply) the first high-frequency signal and the second high-frequency signal and generate a multiplication signal using the second high-frequency signal (a local signal) of low power compared to a construction that uses a semiconductor pn junction diode. Therefore, according to the mixer and a frequency converting apparatus, it is possible to reduce power consumption by an amount corresponding to the reduction in the power of the second high-frequency signal.

In the mixer according to the present invention, the magnetic field applying unit may be constructed so that a strength of the magnetic field is changeable.

By making it possible to change the strength of the magnetic field in the mixer described above, it becomes possible to change the resonant frequency of the magnetoresistive effect element. Therefore, according to the above mixer, it is possible to carry out a mixing operation that mixes a second high-frequency signal (local signal) of various different frequencies with the first high-frequency signal, and as a result, it is possible to make the resonant frequency of the magnetoresistive effect element match the frequency of the second high-frequency signal in a construction where the frequency of the second high-frequency signal is decided in advance.

In the mixer according to the present invention, the magnetic field applying unit may be constructed so that a strength of the magnetic field is fixed.

According to the above mixer, since the construction of the magnetic field applying unit can be simplified, it is possible to reduce the manufacturing cost.

The mixer according to the present invention may further include a capacitance element connected in series to the magnetoresistive effect element, and the first high-frequency signal and the second high-frequency signal may be inputted into the magnetoresistive effect element via the capacitance element.

According to the above mixer, when a DC voltage is generated in the magnetoresistive effect element, it is possible for the capacitance element to prevent the DC voltage from leaking and to protect the magnetoresistive effect element and the like.

The mixer according to the present invention may include a transistor that inputs and amplifies the multiplication signal.

According to the above mixer, by using a simple construction, it is possible to provide the mixer with an amplification function while reducing the manufacturing cost.

A frequency converting apparatus according to the present invention includes: any of the mixers described above; and a filter operable, when a higher frequency and a lower frequency out of frequencies of the first high-frequency signal and the second high-frequency signal are expressed as f1 and f2 respectively, to pass one out of a frequency (f1+f2) and a frequency (f1−f2) out of the multiplication signal.

According to the above frequency converting apparatus, it is possible to generate the multiplication signal of only one of the frequencies (i.e., a desired frequency) out of (f1+f2) and (f1−f2).

The frequency converting apparatus according to the present invention may include a signal generating unit that generates the second high-frequency signal, wherein the signal generating unit may generate the second high-frequency signal with the same frequency as a resonant frequency of the magnetoresistive effect element. In this case, the expression "same frequency" includes a case where the resonant frequency of the magnetoresistive effect element and the frequency of the second high-frequency signal match and a case where the frequency of the second high-frequency signal is close to the resonant frequency of the magnetoresistive effect element.

According to the above frequency converting apparatus, since it is possible to cause strong resonance (spin torque ferromagnetic resonance) of the magnetoresistive effect element, it is possible to reliably cause the magnetoresistive effect element to carry out a square-law detection operation on the high-frequency signals.

It should be noted that the disclosure of the present invention relates to a content of Japanese Patent Application 2008-089569 that was filed on 31 Mar. 2008 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a mixer and a frequency converting apparatus according to the present invention will now be described with reference to the attached drawings.

First, the constructions of a mixer 1 and a frequency converting apparatus 100 that includes the mixer 1 will be described with reference to the drawings. Note that an example where the frequency converting apparatus 100 has been applied to a receiver apparatus RX will be described as an example.

Figure 1:
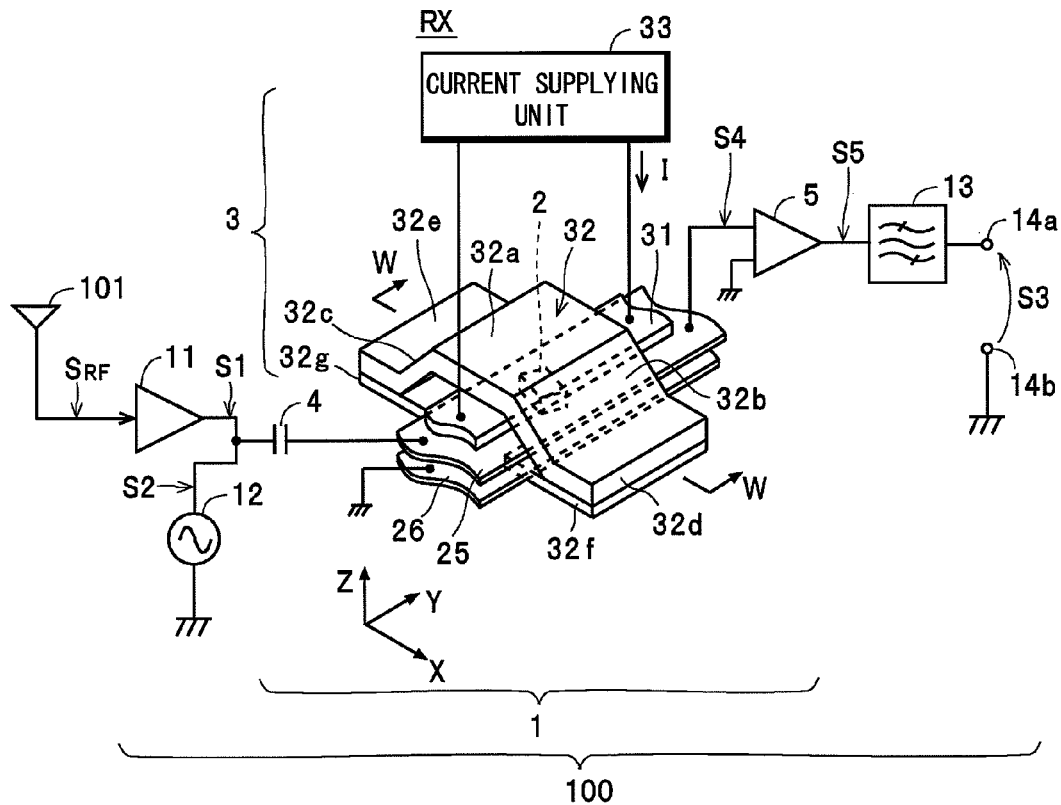
FIG. 1 is a diagram showing the construction of a frequency converting apparatus.

The frequency converting apparatus 100 shown in FIG. 1 constructs the receiver apparatus RX together with an antenna 101. The frequency converting apparatus 100 is disposed at a high-frequency stage of the receiver apparatus RX that receives an RF signal $S_{RF}$ outputted from the antenna 101 and functions so as to convert the frequency of the RF signal $S_{RF}$ to the frequency of a multiplication signal S3. As one example, the frequency converting apparatus 100 includes the mixer 1 and an amplifier 11, a signal generating unit 12, a filter 13, and output terminals 14a, 14b (hereinafter collectively referred to as the "output terminals 14" when no distinction is required). The amplifier 11 inputs and amplifies the RF signal $S_{RF}$ and outputs the result as a signal S1 (a "first high-frequency signal" for the present invention). The signal generating unit 12 functions as a so-called "local oscillator" and generates a local signal (a "second high-frequency signal" for the present invention). As one example, the signal generating unit 12 generates and outputs a −15 dBm±5 dBm local signal S2.

The mixer 1 includes a magnetoresistive effect element 2, a magnetic field applying unit 3, a capacitor 4, and a differential amplifier unit 5, and multiplies the signal S1 outputted from the amplifier 11 and the local signal S2 generated by the signal generating unit 12 and outputs the result as an output signal S5. Note that the signal generating unit 12 is not an essential element for the frequency converting apparatus 100 and it is also possible to use a construction where the local signal S2 is inputted from outside the frequency converting apparatus 100 together with the RF signal $S_{RF}$. The mixer 1 shown in FIG. 1 can be represented by an equivalent circuit such as that shown in FIG. 2.

Figure 3:
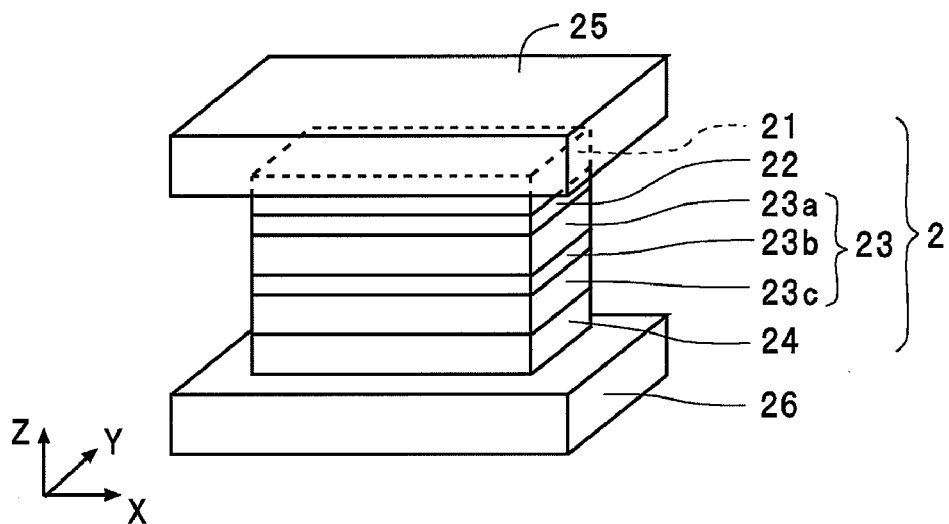
FIG. 3 is a perspective view of the vicinity of a magnetoresistive effect element (TMR element)
Figure 5:
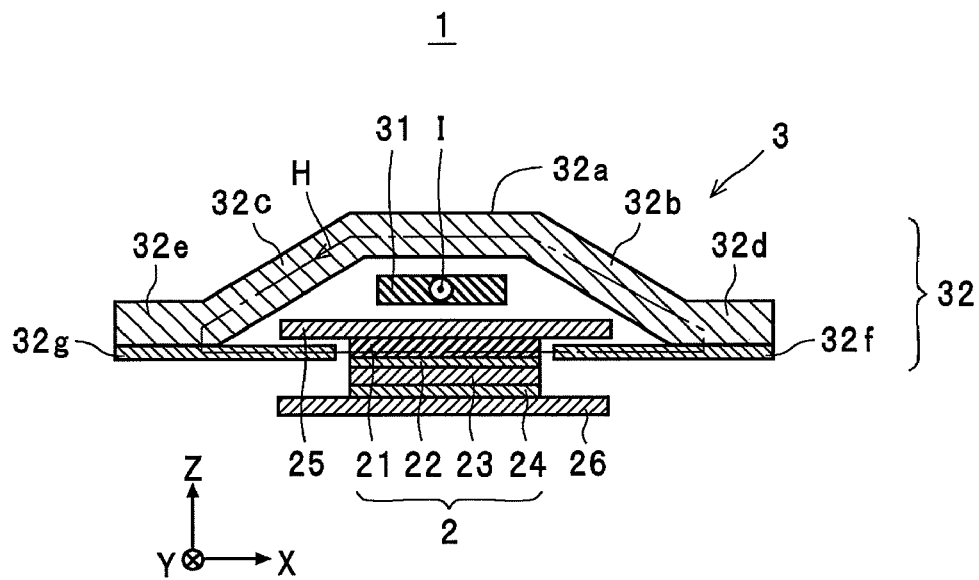
FIG. 5 is a cross-sectional view taken along a line W-W in FIG. 1.

As one example, the magnetoresistive effect element 2 is constructed of a TMR element that includes a free magnetic layer 21 as shown in FIGS. 3 and 5. More specifically, the magnetoresistive effect element 2 includes the free magnetic layer 21, a spacer layer 22, a fixed magnetic layer 23, and an antiferromagnetic layer 24 that are laminated in the mentioned order and are disposed between an upper electrode 25 and a lower electrode 26 in a state where the free magnetic layer 21 is connected to the upper electrode 25 and the antiferromagnetic layer 24 is connected to the lower electrode 26. Here, the free magnetic layer 21 is constructed of a ferromagnetic material as a magnetism-sensing layer. The spacer layer 22 corresponds to a "nonmagnetic spacer layer" for the present invention, and is constructed of a nonmagnetic material that is an insulator so as to function as a tunneling barrier layer. Note that the spacer layer 22 is normally formed with a thickness of 1 nm or below. The lower electrode 26 is also connected to ground.

As one example, as shown in FIG. 3 the fixed magnetic layer 23 is constructed by forming a ferromagnetic layer ("second magnetic layer") 23a whose magnetic orientation is fixed, a nonmagnetic layer 23b made of a metal such as copper (Cu), and another ferromagnetic layer ("first magnetic layer") 23c whose magnetic orientation is fixed in the opposite direction to the magnetic orientation of the ferromagnetic layer 23a, such layers being laminated in the mentioned order so that the ferromagnetic layer 23c is positioned above the antiferromagnetic layer 24. In this case, the respective magnetic orientations of the pair of ferromagnetic layers 23a, 23c are set so as to be perpendicular to the thickness (i.e., the Z axis direction) of the magnetoresistive effect element 2. The antiferromagnetic layer 24 is exchange-coupled with the ferromagnetic layer 23c at the bottom of the fixed magnetic layer 23.

Figure 4:
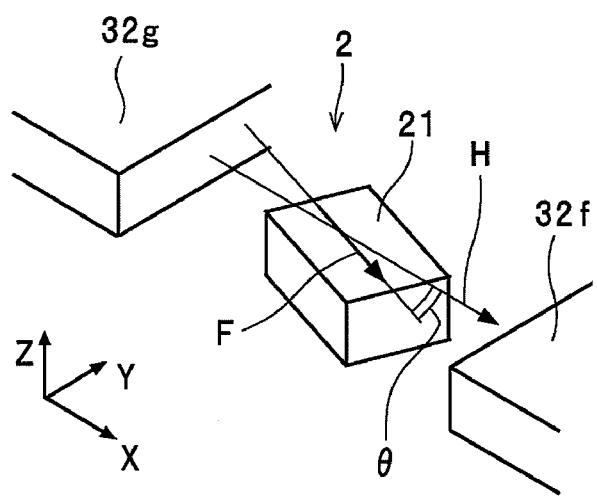
FIG. 4 is a perspective view of the vicinity of a free magnetic layer of the magnetoresistive effect element.

Also, as shown in FIG. 4, in order to facilitate resonance of the magnetic orientation of the free magnetic layer 21, the positional relationship between the magnetoresistive effect element 2 and the magnetic field applying unit 3 is set in advance so that the orientation of the axis of easy magnetization F of the free magnetic layer 21 and the orientation of the magnetic field H applied from the magnetic field applying unit 3 (described later) intersect at a predetermined angle θ (preferably an angle in a range of 5° to 175°, inclusive) on an X-Y plane.

As shown in FIGS. 1 and 5, the magnetic field applying unit 3 includes a magnetic field generating wire 31, a magnetic yoke 32, and a current supplying unit 33. As shown in FIG. 5, the magnetic field generating wire 31 is disposed above the magnetoresistive effect element 2 with the upper electrode 25 in between. The magnetic yoke 32 includes a top magnetic body 32a, side magnetic bodies 32b, 32c, lower magnetic bodies 32d, 32e, and bottom magnetic bodies 32f, 32g. The top magnetic body 32a is disposed above the magnetic field generating wire 31. The side magnetic body 32b is disposed on one side of the magnetic field generating wire 31 (as one example, on the right side in FIG. 5) and is connected to the top magnetic body 32a. The side magnetic body 32c is disposed on the other side of the magnetic field generating wire 31 (as one example, on the left side in FIG. 5) and is also connected to the top magnetic body 32a. The lower magnetic body 32d is disposed on one side of the magnetoresistive effect element 2 (as one example, on the right side in FIG. 5) and is connected to the side magnetic body 32b. The lower magnetic body 32e is disposed on the other side of the magnetoresistive effect element 2 (as one example, on the left side in FIG. 5) and is connected to the side magnetic body 32c. By using this construction, the lower magnetic body 32e, the side magnetic body 32c, the top magnetic body 32a, the side magnetic body 32b, and the lower magnetic body 32d are connected in the mentioned order so as to form an overall band shape and are disposed above the magnetoresistive effect element 2 so as to span the magnetic field generating wire 31 as shown in FIG. 1.

As shown in FIGS. 1 and 5, the bottom magnetic body 32f is disposed below the lower magnetic body 32d in a state where the bottom magnetic body 32f is connected to the lower magnetic body 32d. An end portion on the magnetoresistive effect element 2 side of the bottom magnetic body 32f protrudes into a gap between the upper electrode 25 and the lower electrode 26 of the magnetoresistive effect element 2 as far as the periphery of one side surface of the free magnetic layer 21 of the magnetoresistive effect element 2 but is insulated from the upper electrode 25 and the lower electrode 26. The bottom magnetic body 32g is disposed below the lower magnetic body 32e in a state where the bottom magnetic body 32g is connected to the lower magnetic body 32e. An end portion on the magnetoresistive effect element 2 side of the bottom magnetic body 32e also protrudes into a gap between the upper electrode 25 and the lower electrode 26 as far as the periphery of the other side surface of the free magnetic layer 21 of the magnetoresistive effect element 2 but is insulated from the upper electrode 25 and the lower electrode 26.

With the construction described above, the magnetic yoke 32 forms a closed magnetic path for the magnetic field that is generated in the region of the magnetic field generating wire 31 when a current I flows in the magnetic field generating wire 31. As shown in FIG. 4, the magnetic yoke 32 applies a magnetic field H to the free magnetic layer 21 of the magnetoresistive effect element 2 disposed at the position of a gap in the closed magnetic path (i.e., the gap between the pair of bottom magnetic bodies 32f, 32g). Also, in the present embodiment, as one example, the magnetic field generating wire 31 and the magnetic yoke 32 of the magnetic field applying unit 3 described above are formed together with the magnetoresistive effect element 2 on a silicon wafer by a well-known semiconductor manufacturing process.

The current supplying unit 33 is connected to both ends of the magnetic field generating wire 31 that protrude from both sides of the top magnetic body 32a and supplies the current I to the magnetic field generating wire 31. The current supplying unit 33 is constructed so that the magnitude of the current I can be changed. Accordingly, by changing the magnitude of the current I outputted from the current supplying unit 33, the magnetic field applying unit 3 can change the strength of the magnetic field H applied to the magnetoresistive effect element 2 and to change the resonant frequency f0 of the magnetoresistive effect element 2. Note that although a single magnetic field generating wire 31 is formed so as to pass through inside the magnetic yoke 32, the strength of the magnetic field H can be increased by using a construction where the magnetic field generating wire 31 is formed in a coil shape so that a multiple number of magnetic field generating wires 31 pass inside the magnetic yoke 32.

Figure 2:
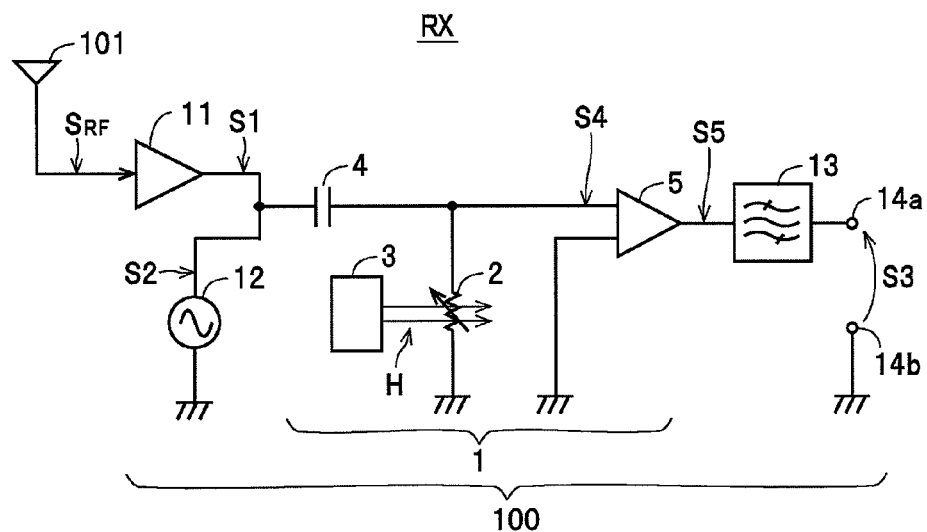
FIG. 2 is a diagram showing the construction of the frequency converting apparatus when a mixer shown in FIG. 1 is represented by an equivalent circuit.

The capacitor (capacitance element) 4 is a so-called "coupling capacitor", and as shown in FIGS. 1 and 2, one end of the capacitor 4 is connected to an output terminal of the amplifier 11 and an output terminal of the signal generating unit 12 and the other end of the capacitor 4 is connected to the magnetoresistive effect element 2. By using this construction, the signal S1 outputted from the amplifier 11 and the local signal S2 generated by the signal generating unit 12 are applied to the magnetoresistive effect element 2 via the capacitor 4. When a DC voltage is generated in the magnetoresistive effect element 2, the capacitor 4 prevents the DC voltage from leaking toward the amplifier 11 and the signal generating unit 12, which protects the magnetoresistive effect element 2 and also protects the amplifier 11 and the signal generating unit 12. The differential amplifier unit 5 is constructed using an operational amplifier, for example, and has one input terminal connected to the upper electrode 25 and another input terminal connected to ground. By doing so, the differential amplifier unit 5 receives the voltage signal S4 that is generated across both ends of the magnetoresistive effect element 2 due to the signal S1 and the local signal S2 being inputted (applied) via the capacitor 4, amplifies the voltage signal S4 and outputs the result as the output signal S5. The filter 13 is formed by a bandpass filter (BPF) as one example, and as described later, passes only a desired frequency out of the output signal S5.

Figure 6:
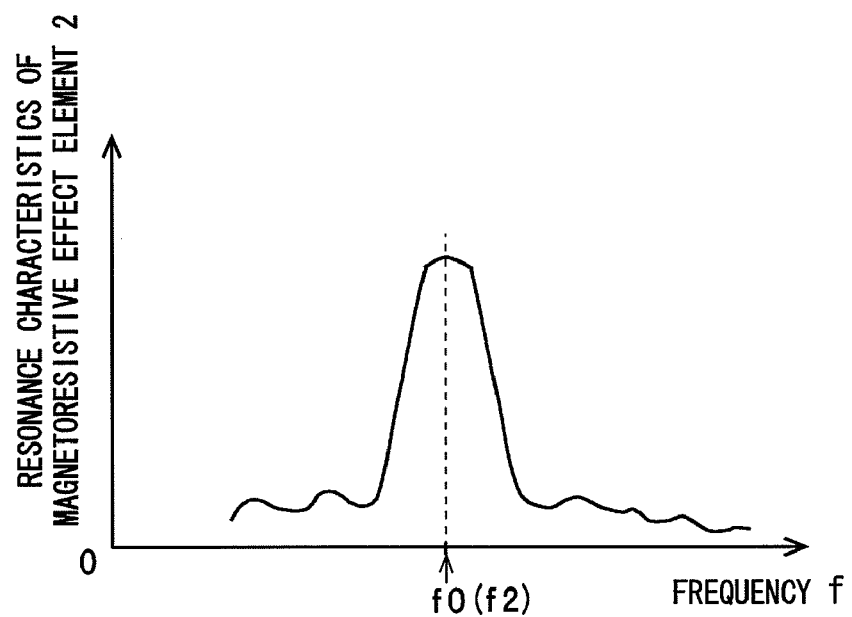
FIG. 6 is a graph showing the relationship between frequency and resonance of the magnetoresistive effect element when a magnetic field applied to the magnetoresistive effect element is constant.

Next, a mixing operation by the mixer 1 and a frequency converting operation by the frequency converting apparatus 100 will be described. As one example, it is assumed that the RF signal $S_{RF}$ (with a frequency f1) received via the antenna 101 is inputted and the signal generating unit 12 generates the local signal S2 (with a frequency f2 (<f1)). The resonance characteristics of the magnetoresistive effect element 2 should preferably have a peak at the frequency f2 of the local signal S2 as shown in FIG. 6. For this reason, the magnitude of the current I supplied from the current supplying unit 33 to the magnetic field generating wire 31 is set at a value that is likely to apply a magnetic field H that matches the resonant frequency f0 to the frequency f2 of the local signal S2 to the magnetoresistive effect element 2. The local signal S2 is set at a power (for example, −15 dBm±5 dBm) that is capable of supplying a current that is likely to cause the magnetoresistive effect element 2 to resonate. Also, although the output signal S5 outputted from the differential amplifier unit 5 due to a mixing operation by the mixer 1 includes at least two frequency components (f1+f2, f1−f2), the filter 13 is constructed so as to pass one out of the frequency components (as one example in the present embodiment, the low frequency component (f1−f2)) and to block passage of the other frequency component (in the present embodiment, the high frequency component (f1+f2)). Here, although the filter 13 is constructed as a bandpass filter, the filter 13 may be a lowpass filter.

In the frequency converting apparatus 100, in a state where the current I is being supplied from the current supplying unit 33 (a state where the magnetic field H is being applied to the magnetoresistive effect element 2), the local signal S2 (with the frequency f2) is inputted from the signal generating unit 12 into the mixer 1. In this state, since the local signal S2 is set so that the frequency f2 thereof matches the resonant frequency f0 of the magnetoresistive effect element 2 and the power thereof is likely to cause the magnetoresistive effect element 2 to resonate, strong resonance (spin torque ferromagnetic resonance) of the magnetoresistive effect element 2 is caused. In this state, when the RF signal $S_{RF}$ (with the frequency f1) is inputted from the antenna 101 to the amplifier 11 and the amplifier 11 starts to output the signal S1, the magnetoresistive effect element 2 will carry out a square-law detection operation on the two signals S1, S2.

When the magnetoresistive effect element 2 is resonating, a square-law detection operation (a rectifying action) can be achieved with a much smaller forward voltage compared to a semiconductor pn junction diode. This means that even when the power of the local signal S2 for causing the magnetoresistive effect element 2 to generate a forward voltage is lower than the power (for example, 10 dBm) required when a semiconductor pn junction diode is used, the magnetoresistive effect element 2 will still carry out a square-law detection operation to multiply the signal S1 and the local signal S2 and generate the voltage signal S4 across both ends thereof. At this time, even if a DC voltage is generated by the magnetoresistive effect element 2, the capacitor 4 will prevent such DC voltage from leaking to the antenna or the signal generating unit 12 (i.e., the capacitor 4 will cut the DC), to protect the magnetoresistive effect element 2 and also protect the antenna and the signal generating unit 12. Next, the differential amplifier unit 5 amplifies the voltage signal S4 and outputs the result as the output signal S5. Next, the filter 13 passes one of the frequency components (the intermediate frequency: f1−f2) out of the two frequencies (f1+f2, f1−f2) included in the output signal S5 and outputs such frequency component to the output terminals 14 as the multiplication signal S3. By doing so, only the desired multiplication signal S3 (with the frequency (f1−f2)) is outputted from the voltage signal (multiplication signal) S4 from the mixer 1 that was produced by multiplying the signal S1 (with the frequency f1) and the local signal S2 (with the frequency f2).

In this way, according to the mixer 1 and the frequency converting apparatus 100, by mixing (multiplying) the signal S1 and the local signal S2 using a square-law detection function (spin torque diode effect) realized when the magnetoresistive effect element 2 resonates, it is possible to mix (multiply) the signal S1 and the local signal S2 and output the multiplication signal S3 (i.e., the frequency component (f1−f2) using a low power local signal S2 compared to a construction that uses a semiconductor pn junction diode. Therefore, according to the mixer 1 and the frequency converting apparatus 100, it is possible to reduce power consumption by an amount corresponding to the reduction in the power of the local signal S2.

Also, with the mixer 1 and the frequency converting apparatus 100, by having the current supplying unit 33 change the magnitude of the current I supplied from the current supplying unit 33 to the magnetic field generating wire 31, it is possible to change the strength of the magnetic field H applied to the magnetoresistive effect element 2 and the resonant frequency f0 of the magnetoresistive effect element 2. Therefore, according to the mixer 1 and the frequency converting apparatus 100, it is possible to carry out a mixing operation that mixes a local signal S2 of various different frequencies with the signal S1, and as a result, it is possible to make the resonant frequency f0 match the frequency of the local signal S2 in a construction where the frequency of the local signal S2 is decided in advance.

Note that the present invention is not limited to the construction described above. For example, although an example has been described where a TMR element is used as the magnetoresistive effect element 2, it is also possible to use another magnetoresistive effect element such as a CPP-GMR (Current-Perpendicular-to-Plane Giant MagnetoResistance) element. Also, although an example has been described where the low-frequency component (f1−f2) out of the two frequency components (f1+f2, f1−f2) included in the output signal S5 outputted from the differential amplifier unit 5 due to a mixing operation by the mixer 1 is passed by a lowpass filter or a bandpass filter, it is also possible to construct the filter 13 of a bandpass filter or a highpass filter in a case where the high-frequency component (f1+f2) is passed and outputted as the multiplication signal S3.

Figure 7:
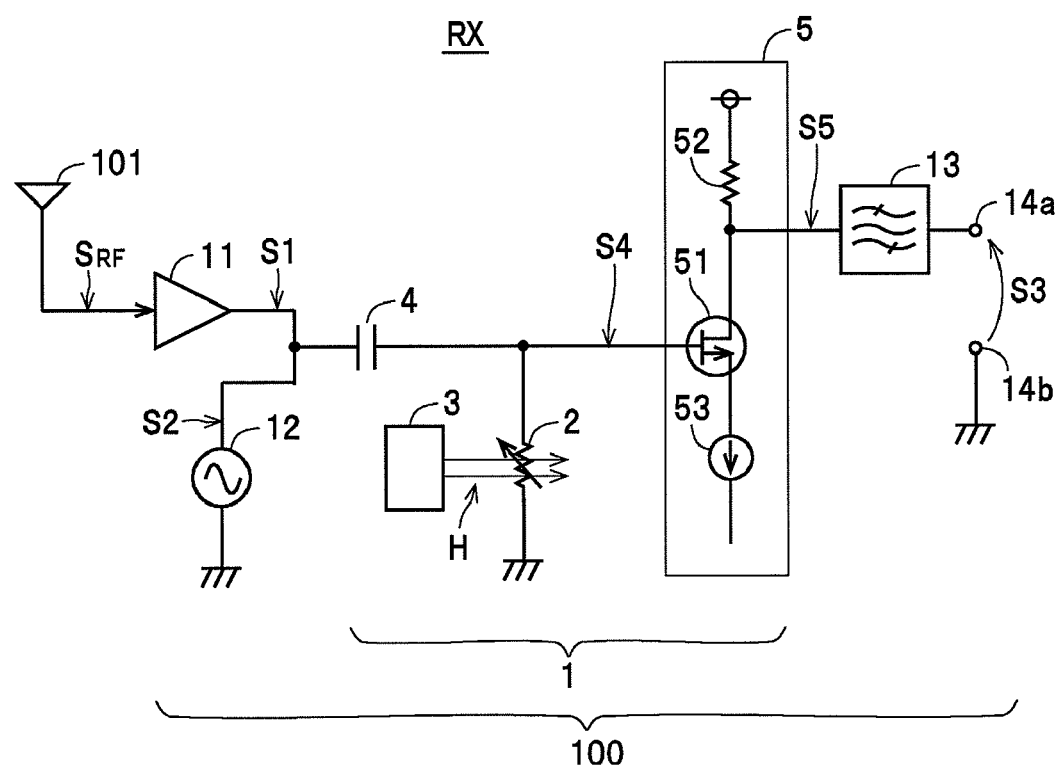
FIG. 7 is a diagram showing the construction of the frequency converting apparatus when a differential amplifier unit in FIG. 1 is constructed by a single transistor.

Also, although an example where the differential amplifier unit 5 is constructed of an operational amplifier has been described, as shown in FIG. 7, it is also possible to construct the differential amplifier unit 5 using a single transistor as shown in FIG. 7 (one example of "at least one transistor", in the present example, a field effect transistor (FET)). In this case, as shown in FIG. 7, when an n-type FET 51 is used as the transistor, the gate terminal is connected to a connection point (for example, the upper electrode 25) between the capacitor 4 and the magnetoresistive effect element 2 and the drain terminal is connected via a resistor 52 to a power supply (Vcc). Also, to cause the transistor 51 to operate in a linear region, a DC constant current power source 53 is provided at the source terminal of the transistor 51. Since this construction makes it possible to simplify the differential amplifier unit 5, it is possible to provide the mixer with an amplification function while reducing the manufacturing cost. It should be obvious that it is also possible to use a bipolar transistor as the transistor.

Although a construction where the strength of the magnetic field H applied from the magnetic field applying unit 3 to the magnetoresistive effect element 2 can be changed is used in the example described above, since the strength of the magnetic field H produced by the magnetic field applying unit 3 may also be fixed when the frequency f2 of the local signal S2 is fixed, it is also possible to use a construction where the magnetic field applying unit 3 is composed of a permanent magnet or the like and the strength of the magnetic field is kept constant. By using this construction, since it is possible to simplify the construction of the magnetic field applying unit 3, it is possible to reduce the manufacturing cost.

Also, although a construction where the frequency f2 of the local signal S2 matches the resonant frequency f0 of the magnetoresistive effect element 2 is used, it should be obvious that the frequency f2 may be a frequency that is merely close to the resonant frequency f0.

What is claimed is:

1. A mixer comprising:
a magnetoresistive effect element including a fixed magnetic layer, a free magnetic layer, and a nonmagnetic spacer layer disposed between the fixed magnetic layer and the free magnetic layer; and
a magnetic field applying unit that applies a magnetic field to the free magnetic layer,
wherein the mixer is operable, when a first high-frequency signal and a second high-frequency signal as a local signal are inputted, to multiply the first high-frequency signal and the second high-frequency signal using the magnetoresistive effect element and to generate a multiplication signal.

2. The mixer according to claim 1,
wherein the magnetic field applying unit is constructed so that a strength of the magnetic field is changeable.

3. The mixer according to claim 1,
wherein the magnetic field applying unit is constructed so that a strength of the magnetic field is fixed.

4. The mixer according to claim 1,
further comprising a capacitance element connected in series to the magnetoresistive effect element,
wherein the first high-frequency signal and the second high-frequency signal are inputted into the magnetoresistive effect element via the capacitance element.

5. The mixer according to claim 1,
further comprising a transistor that inputs and amplifies the multiplication signal.

6. A frequency converting apparatus comprising:
the mixer according to claim 1; and
a filter operable, when a higher frequency and a lower frequency out of frequencies of the first high-frequency signal and the second high-frequency signal are expressed as f1 and f2 respectively, to pass one out of a frequency (f1+f2) and a frequency (f1−f2) out of the multiplication signal.

7. The frequency converting apparatus according to claim 6,
further comprising a signal generating unit that generates the second high-frequency signal,
wherein the signal generating unit generates the second high-frequency signal with the same frequency as a resonant frequency of the magnetoresistive effect element.

* * * * *